United States Patent
Yeh et al.

(10) Patent No.: US 12,061,291 B2
(45) Date of Patent: Aug. 13, 2024

(54) SYSTEMS AND METHODS FOR CONTROLLING LASER POWER IN LIGHT DETECTION AND RANGING (LIDAR) SYSTEMS

(71) Applicant: BEIJING VOYAGER TECHNOLOGY CO., LTD., Beijing (CN)

(72) Inventors: Yu-Ching Yeh, Mountain View, CA (US); Yue Lu, Mountain View, CA (US); Jihua Li, Mountain View, CA (US); Youmin Wang, Mountain View, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 731 days.

(21) Appl. No.: 17/146,389

(22) Filed: Jan. 11, 2021

(65) Prior Publication Data
US 2022/0221557 A1 Jul. 14, 2022

(51) Int. Cl.
*G01S 7/484* (2006.01)
*G01S 17/931* (2020.01)
*H01S 5/062* (2006.01)

(52) U.S. Cl.
CPC .......... *G01S 7/484* (2013.01); *H01S 5/06203* (2013.01); *G01S 17/931* (2020.01)

(58) Field of Classification Search
CPC .......... G01S 7/484; G01S 17/89; G01S 17/10; G01S 17/931; H01S 5/0427; H01S 5/06213; H01S 5/06216; H01S 5/0428; H01S 5/062; H01S 5/06203; H01S 5/06209; H01S 3/10038; H03K 3/57; H03K 5/01
See application file for complete search history.

(56) References Cited

U.S. PATENT DOCUMENTS

2015/0346325 A1* 12/2015 Giacotto .................. G01C 3/08
356/5.01
2016/0261090 A1* 9/2016 Sakai ..................... H01S 5/0428
(Continued)

OTHER PUBLICATIONS

International Search Report issued in corresponding International Application No. PCT/US2021/061961, mailed Apr. 5, 2022, 4 pages.
(Continued)

*Primary Examiner* — Luke D Ratcliffe
(74) *Attorney, Agent, or Firm* — BAYES PLLC

(57) ABSTRACT

Embodiments of the disclosure provide a system for controlling laser pulses emitted by an optical sensing device. The system may include a laser emitter configured to emit a plurality of laser pulses, a power source configured to deliver electrical currents to the laser emitter, and a control circuit configured to deliver electrical currents from the power source to the laser emitter. The control circuit may include a first control path configured to deliver a first electrical current rising at a first rate from the power source to the laser emitter to emit a first laser pulse. The control circuit may also include a second control path configured to deliver a second electrical current rising at a second rate from the power source to the laser emitter to emit a second laser pulse following the first laser pulse. The second rate may be higher than the first rate.

17 Claims, 8 Drawing Sheets

(56) References Cited

U.S. PATENT DOCUMENTS

| | | |
|---|---|---|
| 2017/0082746 A1* | 3/2017 | Kubota .................. G01S 17/42 |
| 2018/0246211 A1* | 8/2018 | Becht .................... G01S 7/4861 |
| 2018/0261975 A1* | 9/2018 | Pavlov .................. G01S 7/4816 |
| 2018/0278017 A1 | 9/2018 | Mignoli et al. |
| 2019/0229493 A1 | 7/2019 | Stern |
| 2020/0203923 A1 | 6/2020 | Yu et al. |
| 2020/0343688 A1 | 10/2020 | Chapman et al. |
| 2020/0400785 A1 | 12/2020 | Peretz |

OTHER PUBLICATIONS

Written Opinion of the International Searching Authority issued in corresponding International Application No. PCT/US2021/061961, mailed Apr. 5, 2022, 4 pages.

* cited by examiner

SYSTEMS AND METHODS FOR CONTROLLING LASER POWER IN LIGHT DETECTION AND RANGING (LIDAR) SYSTEMS

TECHNICAL FIELD

The present disclosure relates to Light Detection and Ranging (LiDAR) systems, and more particularly to, systems and methods for controlling power of laser pulses in the LiDAR systems.

BACKGROUND

Optical sensing systems such as LiDAR systems have been widely used in autonomous driving and producing high-definition maps. For example, a typical LiDAR system measures the distance to a target by illuminating the target with pulsed laser light beams and measuring the reflected pulses with a sensor such as a photodetector. Differences in laser light return times, wavelengths, and/or phases can then be used to construct digital three-dimensional (3D) representations of the target. Because using a narrow laser beam as the incident light can map physical features with very high resolution, a LiDAR system is particularly suitable for applications such as sensing in autonomous driving and/or high-definition map surveys.

A LiDAR system can use a transmitter to transmits a signal (e.g., pulsed laser light) into the surroundings, and use a receiver to collect the returned signal (e.g., laser light reflected by an object in the surroundings). The LiDAR system can then calculate parameters such as the distance between the object and the LiDAR system based on, e.g., the speed of light and the time the signal travels (e.g., the duration of time between the time the signal is transmitted and the time the returned signal is received) and use the parameters to construct 3D maps and/or models of the surroundings. To improve the detection range and the signal-to-noise-ratio (SNR), higher energy of the laser light is often needed. On the other hand, however, the energy of the signal also needs to be limited to avoid potential harm to human eyes. Therefore, it is challenging to balance the performance demands and regulatory safety mandate in LiDAR system development.

Embodiments of the disclosure address the above challenges by systems and methods for controlling power of laser pulses used in LiDAR systems.

SUMMARY

Embodiments of the disclosure provide a system for controlling laser pulses emitted by an optical sensing device. The system may include a laser emitter configured to emit a plurality of laser pulses, a power source coupled to the laser emitter and configured to deliver electrical currents to the laser emitter for emitting the plurality of laser pulses, and a control circuit configured to deliver electrical currents from the power source to the laser emitter. The control circuit may include a first control path configured to deliver a first electrical current rising at a first rate from the power source to the laser emitter to emit a first laser pulse. The control circuit may also include a second control path configured to deliver a second electrical current rising at a second rate from the power source to the laser emitter to emit a second laser pulse following the first laser pulse. The second rate may be higher than the first rate.

Embodiments of the disclosure also provide a method for controlling laser pulses emitted by an optical sensing device. The method may include providing, by a controller of the optical sensing device, a first control signal to a first control path to deliver a first electrical current rising at a first rate from a power source to a laser emitter to emit a first laser pulse to an environment surrounding the optical sensing device. The method may also include determining, by the controller, whether an object is present in the environment based on feedback received from the environment resulting from the emission of the first laser pulse. After it is determined that no object is present in the environment, the method may further include, providing, by the controller, a second control signal to a second control path to deliver a second electrical current rising at a second rate from the power source to the laser emitter to emit a second laser pulse to the environment. The second rate may be higher than the first rate.

Embodiments of the disclosure also provide an optical sensing system. The optical sensing system may include a laser emitter configured to emit a plurality of laser pulses, a control circuit coupled to the laser emitter and configured to deliver electrical currents from a power source to the laser emitter to emit the plurality of laser pulses, and a controller coupled to the control circuit and configured to provide control signals to the control circuit to control delivery of the electrical currents. The control circuit may include a first control path configured to deliver a first electrical current rising at a first rate from the power source to the laser emitter to emit a first laser pulse to an environment surrounding the optical sensing system. The controller may be configured to determine whether an object is present in the environment based on feedback from the environment resulting from the emission of the first laser pulse. The control circuit may further include a second control path configured to deliver a second electrical current rising at a second rate from the power source to the laser emitter to emit a second laser pulse following a determination that no object is present in the environment. The second rate may be higher than the first rate.

It is to be understood that both the foregoing general description and the following detailed description are exemplary and explanatory only and are not restrictive of the invention, as claimed.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

Figure 1:
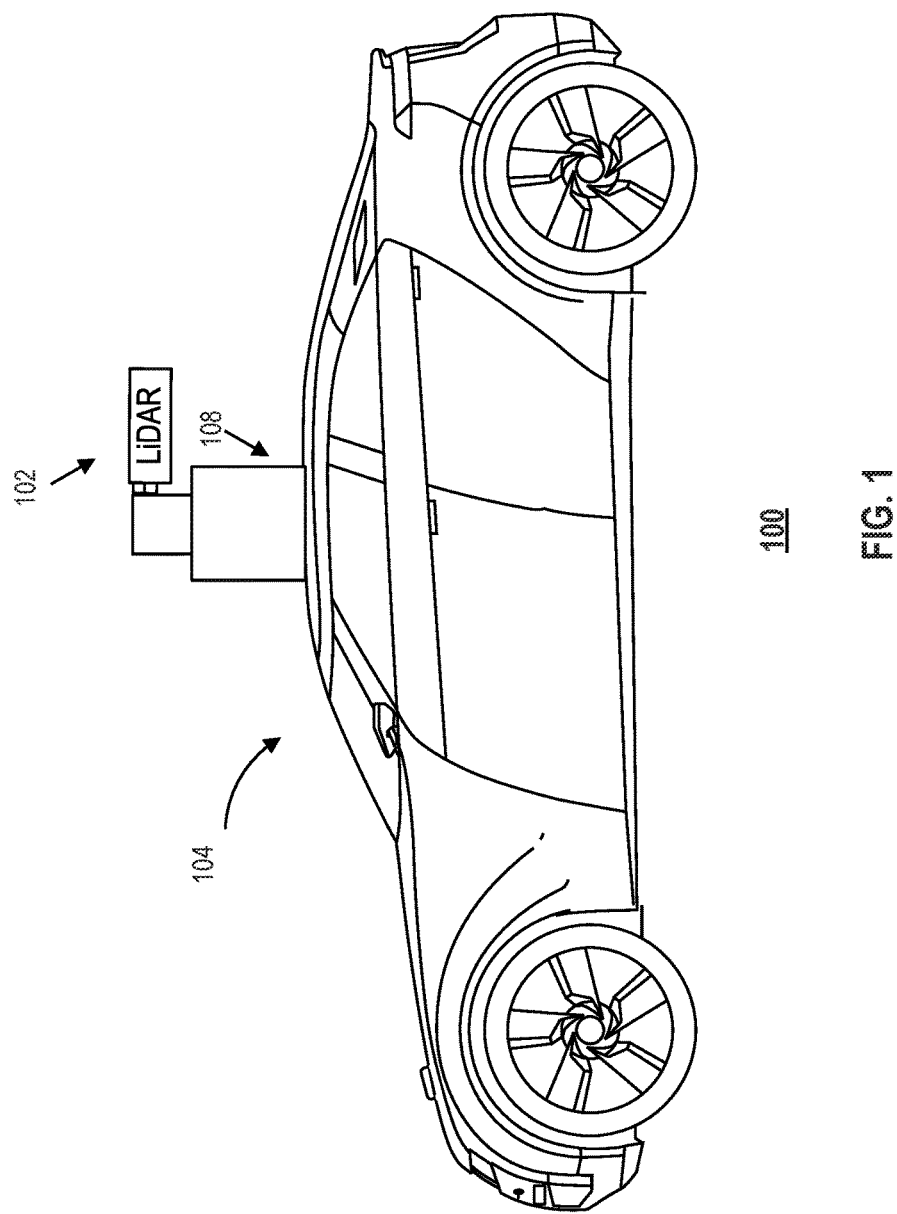
FIG. 1 illustrates a schematic diagram of an exemplary vehicle equipped with a LiDAR system, according to embodiments of the disclosure.

FIG. 1 illustrates a schematic diagram of an exemplary vehicle 100 equipped with a LiDAR system 102, according to embodiments of the disclosure. Consistent with some embodiments, vehicle 100 may be a survey vehicle configured for acquiring data for constructing a high-definition map or 3-D buildings and city modeling. Vehicle 100 may also be an autonomous driving vehicle.

As illustrated in FIG. 1, vehicle 100 may be equipped with an optical sensing system (e.g., a LiDAR system) 102 (also referred to as "LiDAR system 102" hereinafter) mounted to a body 104 via a mounting structure 108. Mounting structure 108 may be an electro-mechanical device installed or otherwise attached to body 104 of vehicle 100. In some embodiments of the present disclosure, mounting structure 108 may use screws, adhesives, or another mounting mechanism. In some embodiments, LiDAR system 102 may be integrated with body 104 of vehicle 100 without using mounting structure 108. It is contemplated that the manners in which LiDAR system 102 can be equipped on vehicle 100 are not limited by the example shown in FIG. 1 and may be modified depending on the types of LiDAR system 102 and/or vehicle 100 to achieve desirable 3D sensing performance.

Consistent with some embodiments, LiDAR system 102 may be configured to capture data as vehicle 100 moves along a trajectory. For example, a transmitter of LiDAR system 102 may be configured to scan the surrounding environment. LiDAR system 102 measures distance to a target by illuminating the target with laser beams and measuring the reflected/scattered laser signals with a receiver. The laser beams used for LiDAR system 102 may be ultraviolet, visible, or near-infrared, and may be pulsed or continuous wave laser beams. In some embodiments, LiDAR system 102 may capture point clouds including depth information of the objects in the surrounding environment, which may be used for constructing a high-definition map or 3-D buildings and city modeling. As vehicle 100 moves along the trajectory, LiDAR system 102 may continuously capture data including the depth information of the surrounding objects (such as moving vehicles, buildings, road signs, pedestrians, etc.) for a map, building, or city modeling construction.

Consistent with the present disclosure, a controller may be included for processing and/or analyzing collected data for various operations. For example, the controller may process received signals and control any operations based on the processed signals. The controller may also communicate with a remote computing device, such as a server (or any suitable cloud computing system) for operations of LiDAR system 102. Components of the controller may be in an integrated device or distributed at different locations but communicate with one another through a network. In some embodiments, the controller may be located entirely within LiDAR system 102. In some embodiments, one or more components of the controller may be located in LiDAR system 102, inside vehicle 100, or may be alternatively in a mobile device, in the cloud, or another remote location.

In some embodiments, the controller may process the received signal locally. In some alternative embodiments, the controller is connected to a server for processing the received signal. For example, the controller may stream the received signal to the server for data processing and receive the processed data from the server.

Figure 2:
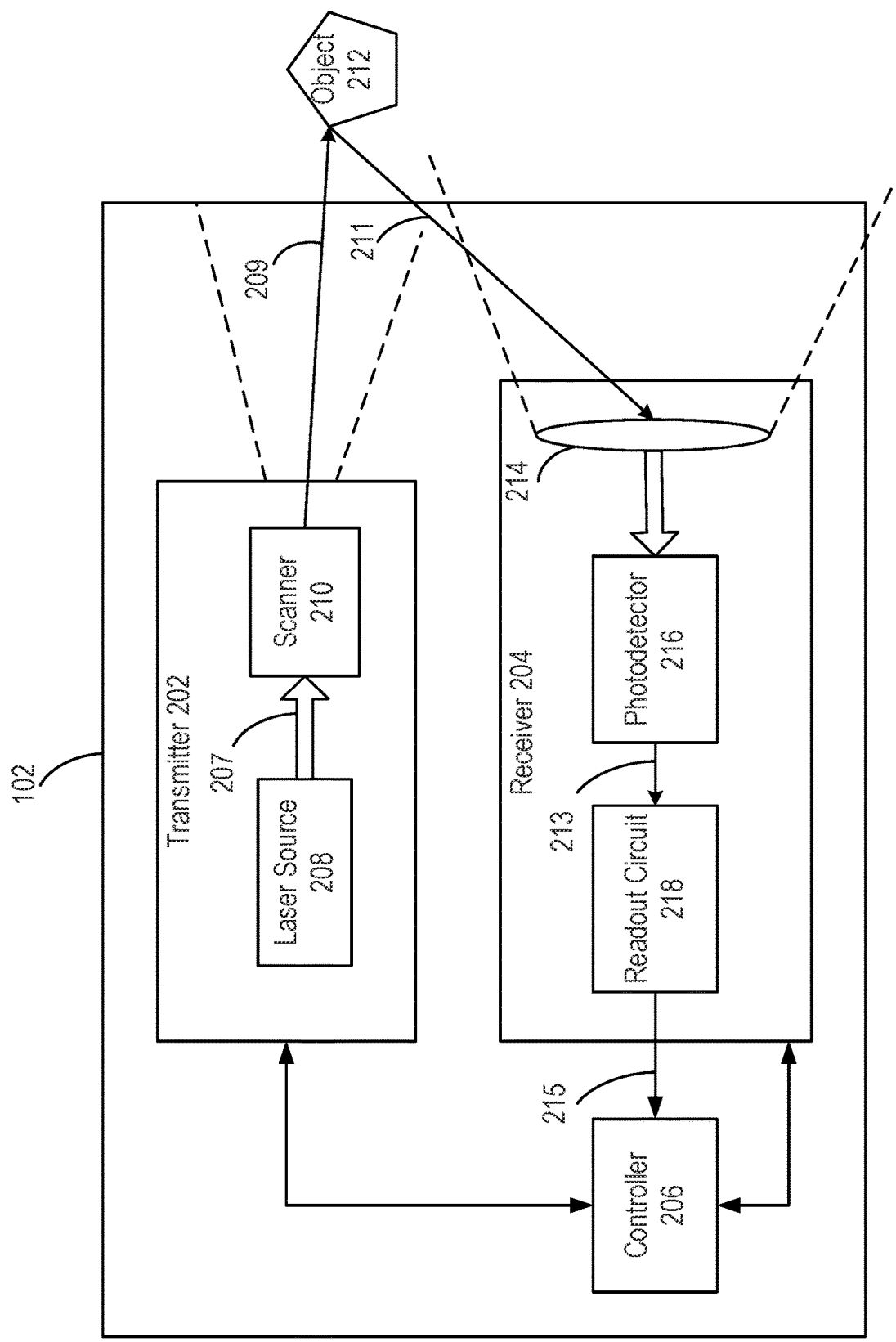
FIG. 2 illustrates a block diagram of an exemplary LiDAR system, according to embodiments of the disclosure.

FIG. 2 illustrates a block diagram of an exemplary LiDAR system, according to embodiments of the disclosure. As illustrated, LiDAR system 102 may include a transmitter 202, a receiver 204, and a controller 206 coupled to transmitter 202 and receiver 204. Transmitter 202 may emit optical beams (e.g., pulsed laser beams, continuous wave (CW) beams, frequency modulated continuous wave (FMCW) beams, etc.) along multiple directions. Transmitter 202 may include one or more laser sources 208 for emitting laser beams and one or more scanners 210 for directing the emitted laser beams into multiple directions. According to one example, transmitter 202 may sequentially emit a stream of laser beams in different directions within a scan filed-of-view (FOV) (e.g., a range in angular degrees), as illustrated by dotted-dashed lines in FIG. 2.

Laser source 208 may be configured to emit laser beams 207 (also referred to as "native laser beams") to scanner 210. For instance, laser source 208 may generate laser beams in the ultraviolet, visible, or near-infrared wavelength range, and provide the generated laser beams to scanner 210. In some embodiments, depending on underlying laser technology used for generating laser beams, laser source 208 may include one or more of a double heterostructure (DH) laser emitter, a quantum well laser emitter, a quantum cascade laser emitter, an interband cascade (ICL) laser emitter, a separate confinement heterostructure (SCH) laser emitter, a distributed Bragg reflector (DBR) laser emitter, a distributed feedback (DFB) laser emitter, a vertical-cavity surface-emitting laser (VCSEL) emitter, a vertical-external-cavity surface-emitting laser (VECSEL) emitter, an extern-cavity diode laser emitter, etc., or any combination thereof. Depending on the number of laser emitting units included in laser source 208, laser source 208 may include a single emitter containing a single light-emitting unit, a multi-emitter unit containing multiple single emitters packaged in a single chip, an emitter array or laser diode bar containing multiple (e.g., 10, 20, 30, 40, 50, etc.) single emitters in a single substrate, an emitter stack containing multiple laser diode bars or emitter arrays vertically and/or horizontally built up in a single package, etc., or any combination thereof. Depending on the operating time, laser source 208 may include one or more of a pulsed laser diode (PLD), a CW laser diode, a Quasi-CW laser diode, etc., or any combination thereof. Depending on the semiconductor materials of diodes in laser source 208, the wavelength of laser beams 207 may be at different values, such as 405 nm, between 445 nm and 465 nm, between 510 nm and 525 nm, 532 nm, 635 nm, between 650 nm and 660 nm, 670 nm, 760 nm, 785 nm, 808 nm, 848 nm, 870 nm, 905 nm, 940 nm, 980 nm, 1064 nm, 1083 nm, 1310 nm, 1370 nm, 1480 nm, 1512 nm, 1550 nm, 1625 nm, 1654 nm, 1877 nm, 1940 nm, 2000 nm, etc. It is understood that any suitable laser source may be used as laser source 208 for emitting laser beams 207 at a proper wavelength.

Transmitter 202 may include one or more optical components (not shown) such as lenses, mirrors, etc. that can shape the laser light (e.g., laser beams 207), e.g., collimate the laser light into a narrow laser beam 209, to increase scan resolution and/or scan range. Scanner 210 may be configured to alter the emission angle of laser beams 209 to scan the FOV of transmitter 202 to detect an object 212 in the surrounding environment.

Object 212 may be made of a wide range of materials including, for example, non-metallic objects, rocks, rain, chemical compounds, aerosols, clouds, and even single molecules. The wavelength of laser beams 209 may be adjusted based on the composition of object 212. In some embodiments, at each time point during the scan, scanner 210 may emit laser beams 209 to object 212 in a direction within a range of scanning angles by rotating a deflector, such as a micromachined mirror assembly.

Receiver 204 may be configured to detect returned laser beams 211 returned from object 212. Upon contact with object 212, laser light can be reflected/scattered by object 212 via backscattering, such as Rayleigh scattering, Mie scattering, Raman scattering, and fluorescence. Returned laser beams 211 may be in a same or different direction from laser beams 209. For instance, in some embodiments, receiver 204 may be disposed in close proximity to transmitter 202 to detect returned laser beams 211 that may be in a same direction (albeit opposite) as laser beams 209. On the other hand, receiver 204 may be located elsewhere to detect the returned laser beams 211 that may be in a different direction from laser beams 209. In some embodiments, after receiving laser beams 211 returned from object 212, receiver 204 may process the received laser beams and output signals reflecting the intensity of returned laser beams 211.

In some embodiments, receiver 204 may include a lens 214, a photodetector 216, and a readout circuit 218. Lens 214 may be configured to collect light from a respective direction in a receiver FOV (shown by dotted-dashed lines) and converge the returned laser beams 211 to focus on photodetector 216. At each time point during the scan, returned laser beams 211 may be collected by lens 214. Laser signals in returned laser beams 211 may have the same waveform (e.g., bandwidth and wavelength) as those in laser beams 209.

Photodetector 216 may be configured to detect returned laser beams 211 returned from object 212 and converged by lens 214. In some embodiments, photodetector 216 may convert the laser light (e.g., returned laser beams 211) converged by lens 214 into an electrical signal 213 (e.g., a current or a voltage signal). Electrical signal 213 may be an analog signal, or even a digital signal in some embodiments, which is generated when photons are absorbed in a photosensor included in photodetector 216. In some embodiments, photodetector 216 may include a PIN detector, an avalanche photodiode (APD) detector, a single-photon avalanche diode (SPAD) detector, a silicon photo multiplier (SiPM) detector, or the like.

Readout circuit 218 may be configured to integrate, amplify, filter, and/or multiplex signals detected by photodetector 216 and transfer the integrated, amplified, filtered, and/or multiplexed signal 215 to controller 206 for further processing. In some embodiments, readout circuit 218 may act as an interface between photodetector 216 and a signal processing unit (e.g., controller 206). Depending on the configuration, readout circuit 218 may include one or more of a transimpedance amplifier (TIA), an analog-to-digital converter (ADC), a time-to-digital converter (TDC), or the like.

Controller 206 may be configured to control transmitter 202 and/or receiver 204 to perform optical signal sensing/detection operations. For instance, controller 206 may control laser source 208 to emit laser beams 207, or control scanner 210 to direct laser beams 209 into multiple directions. In some embodiments, controller 206 may also be implemented to perform data acquisition and analysis functions. For instance, controller 206 may collect digitalized signal information from readout circuit 218, determine the distance of object 212 from LiDAR system 102 according to the travel time of laser beams, and construct a high-definition map or 3-D buildings or city modeling surrounding LiDAR system 102 based on the distance information of object(s) 212.

In some embodiments, partial or full functions of controller 206 may be distributed to a similar component (e.g., a microcontroller) located in transmitter 202, receiver 204, or distributed to another local or remote computing device.

Figure 3:
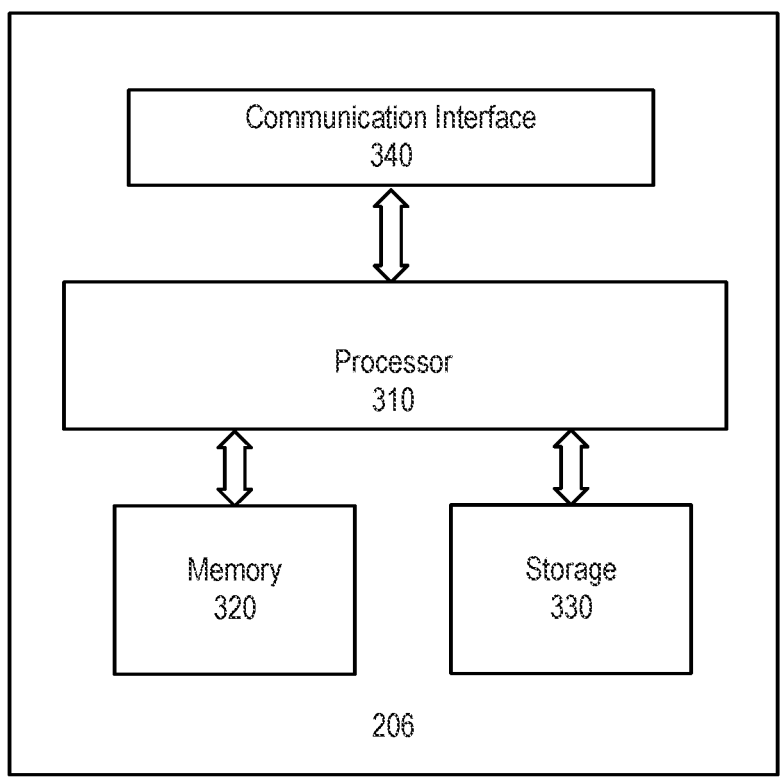
FIG. 3 illustrates a block diagram of an exemplary controller for controlling the power of laser pulses in a LiDAR system, according to embodiments of the disclosure.

FIG. 3 shows an exemplary implementation of controller 206, according to embodiments of the disclosure. As shown in FIG. 3, controller 206 may include a communication interface 340, a processor 310, a memory 320, and a storage 330. In some embodiments, controller 206 may have different modules in a single device, such as an integrated circuit (IC) chip (implemented as, for example, an application-specific integrated circuit (ASIC) or a field-programmable gate array (FPGA)), or separate devices with dedicated functions. In some embodiments, one or more components of controller 206 may be located in a cloud, or may be alternatively in a single location (such as inside vehicle 100 or a mobile device) or distributed locations. Components of controller 206 may be in an integrated device, or distributed at different locations but communicate with each other through a network.

Communication interface 340 may send data to and receive data from components such as receiver 204 and transmitter 202 via communication cables, a Wireless Local Area Network (WLAN), a Wide Area Network (WAN), wireless communication links such as radio waves, a cellular network, and/or a local or short-range wireless network (e.g., Bluetooth™), or other communication methods. In some embodiments, communication interface 340 can be an integrated services digital network (ISDN) card, cable modem, satellite modem, or a modem to provide a data communication connection. As another example, communication interface 340 can be a local area network (LAN) card to provide a data communication connection to a compatible LAN. Wireless links can also be implemented by communication interface 340. In such an implementation, communication interface 340 can send and receive electrical, electromagnetic or optical signals that carry digital data streams representing various types of information.

Processor 310 may include any appropriate type of general-purpose or special-purpose microprocessor, digital signal processor, or microcontroller. Processor 310 may be configured as a stand-alone processor module dedicated to analyzing signals and/or controlling the emission of laser pulses. Alternatively, processor 310 may be configured as a shared processor module for performing other functions unrelated to signal analysis/laser pulse emission control.

Memory 320 and storage 330 may include any appropriate type of mass storage provided to store any type of information that processor 310 may need to operate. Memory 320 and/or storage 330 may be volatile or non-volatile, magnetic, semiconductor-based, tape-based, optical, removable, non-removable, or other type of storage device or tangible (i.e., non-transitory) computer-readable medium including, but not limited to, a ROM, a flash memory, a dynamic RAM, a static RAM, a hard disk, an SSD, an optical disk, etc. Memory 320 and/or storage 330 may be configured to store one or more computer programs that may be executed by processor 310 to perform functions disclosed herein. For example, memory 320 and/or storage 330 may be configured to store program(s) that may be executed by processor 310 to analyze LiDAR signals and/or control laser pulse emission.

In a LiDAR system, the detection distance and image resolution highly depend on the power level of laser output, e.g., power of laser beam 209. For example, the power of laser beam 209 needs to be sufficiently high for LiDAR system 102 to detect object 212 from a desired distance. However, in many LiDAR systems, laser power is strictly regulated due to its potential damage to human eyes. Traditionally, the energy or power of each laser pulse is set to be within the regulation/safety limit, based on the assumption or worst case scenario that all pulses emitted towards a 7 mm pupil-size aperture is absorbed by the aperture. For high resolution and long-range LiDAR systems, this becomes a fundamental challenge. First, high resolution LiDAR may transmit more pulses with small spatial step size, which means 10 or more pulses would be inside the 7 mm pupil area at close distance, forcing each pulse to be lower energy. Also, long distance LiDAR requires high energy pulses, which is difficult or even impossible to achieve with the power limit set by the regulation.

To reach longer detection distance without violating the eye-safety rules, a two-pulse laser emission scheme has been developed, in which the first laser pulse having low power is used to detect whether there is any object present in the near-field. If no object in the near-field is detected, the second laser pulse having much higher power is then emitted for far-field, long-distance detection. To maintain relevancy of the detection result of the first laser pulse, the second laser pulse needs to be emitted shortly after the first laser pulse. For example, the interval between the two pulses may be in the order of nano seconds, e.g., less than 100 nano seconds, less than 10 nano seconds, or even a few nano seconds. Within such a small interval, it is difficult to generate two pulses having a large power ratio, because the same laser emitter is usually used to generate both pulses and the typical driving circuit of the laser emitter cannot be reconfigured fast enough.

The present disclosure provides systems and methods for achieving high power ratio between the second laser pulse and the first laser pulse by increasing the driving current rising rate of the second laser pulse so that the power of the second laser pulse builds up much faster than that of the first laser pulse. Details of the embodiments are described in greater detail as follows.

Figure 4:
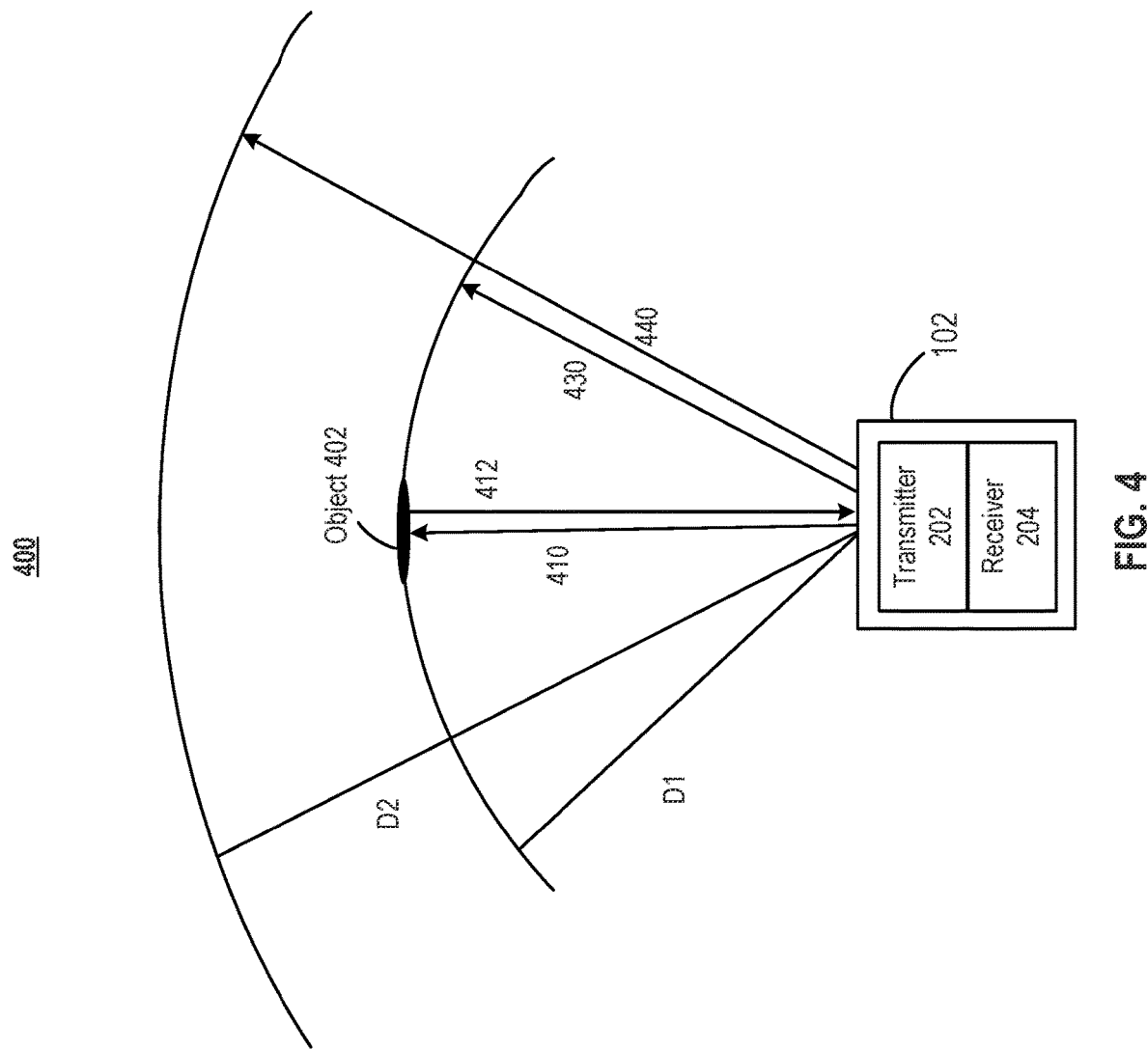
FIG. 4 illustrates an exemplary two-pulse laser emission method, according to embodiments of the disclosure.

FIG. 4 illustrates an exemplary two-pulse laser emission method, according to embodiments of the disclosure. As shown in FIG. 4, an environment surrounding LiDAR system 102 can be schematically divided into a near-field region (e.g., within distance D1 from LiDAR system 102) and a far-field region (e.g., outside distance D1, such as at a distance D2>D1). It is noted that the division between near- and far-field regions can be system dependent, and may not have a clear boundary as shown in FIG. 4. The purpose of the two-pulse laser emission method is to ensure that no high-power laser pulse is emitted along a direction in which an object is present in the near-field region. Such an object can be detected by a low-power laser pulse (also referred to as a pilot laser pulse or the first laser pulse) before any high-power laser pulse (also referred to as a follow-up laser pulse or the second laser pulse) is emitted along the same direction as the lower-power laser pulse. For example, as shown in FIG. 4, transmitter 202 may first emit a low-power laser pulse 410 into the environment along a scanning direction. The power of laser pulse 410 may be under the power threshold set by the eye-safety regulations. If an object 402 is present along the scanning direction, laser pulse 410 is reflected back as a reflected laser pulse 412 and detected by receiver 204. Because an object is detected in the near-field region, no follow-up high-power laser pulse will be emitted. In another example, transmitter 202 may emit another low-power laser pulse 430 along another scanning direction. This time, no object is present, so no laser pulse is reflected back, or any returned laser pulse is not strong enough to indicate the presence of an object. Transmitter 202 then emit a high-power laser pulse 440 shortly after low-power laser pulse 430 along the same direction of low-power laser pulse 430 to reach the far-field region. In this way, the detection range of LiDAR system 102 can be increased.

Figure 5:
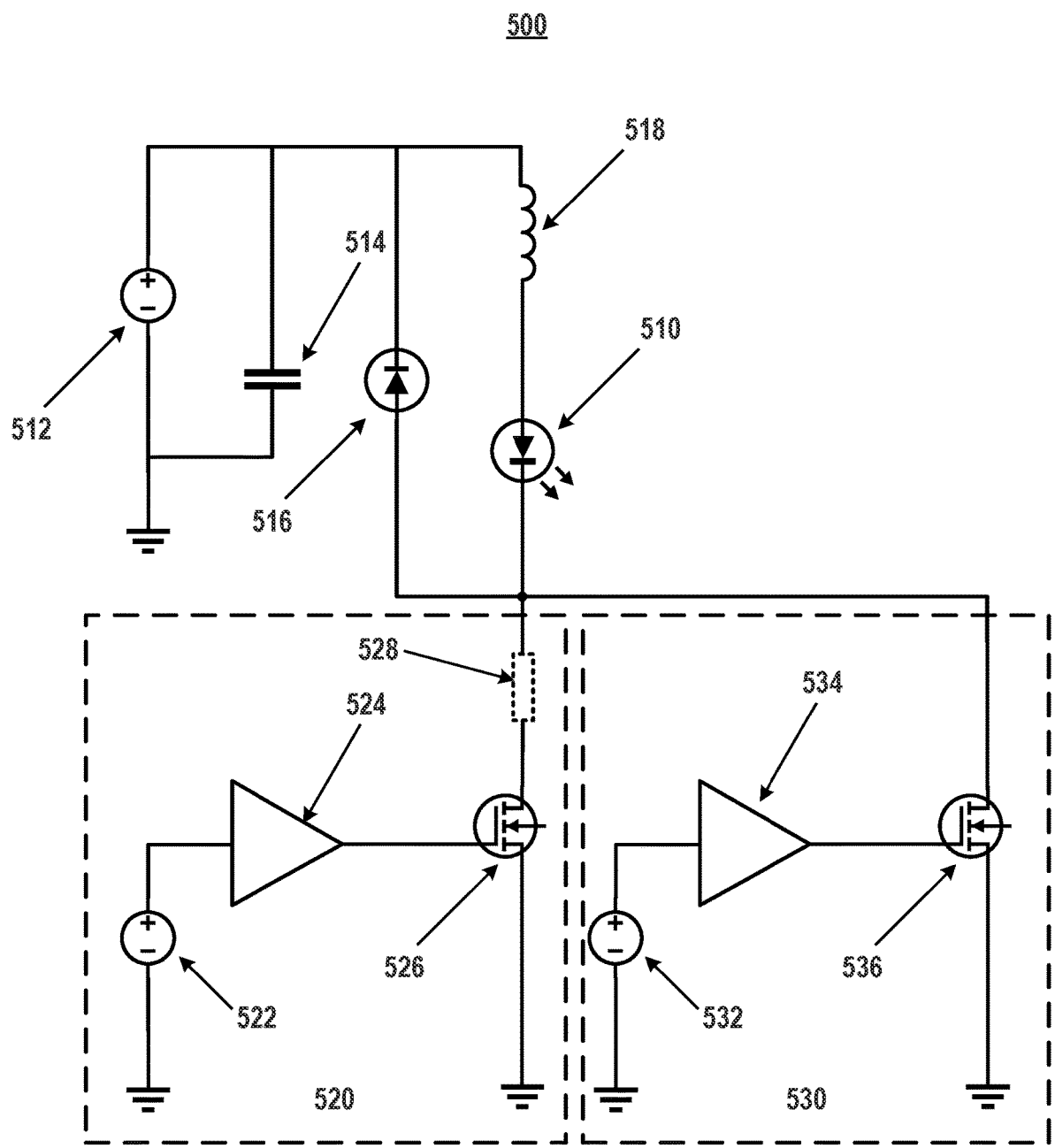
FIG. 5 illustrates an exemplary control system for a LiDAR system, according to embodiments of the disclosure.
Figure 6:
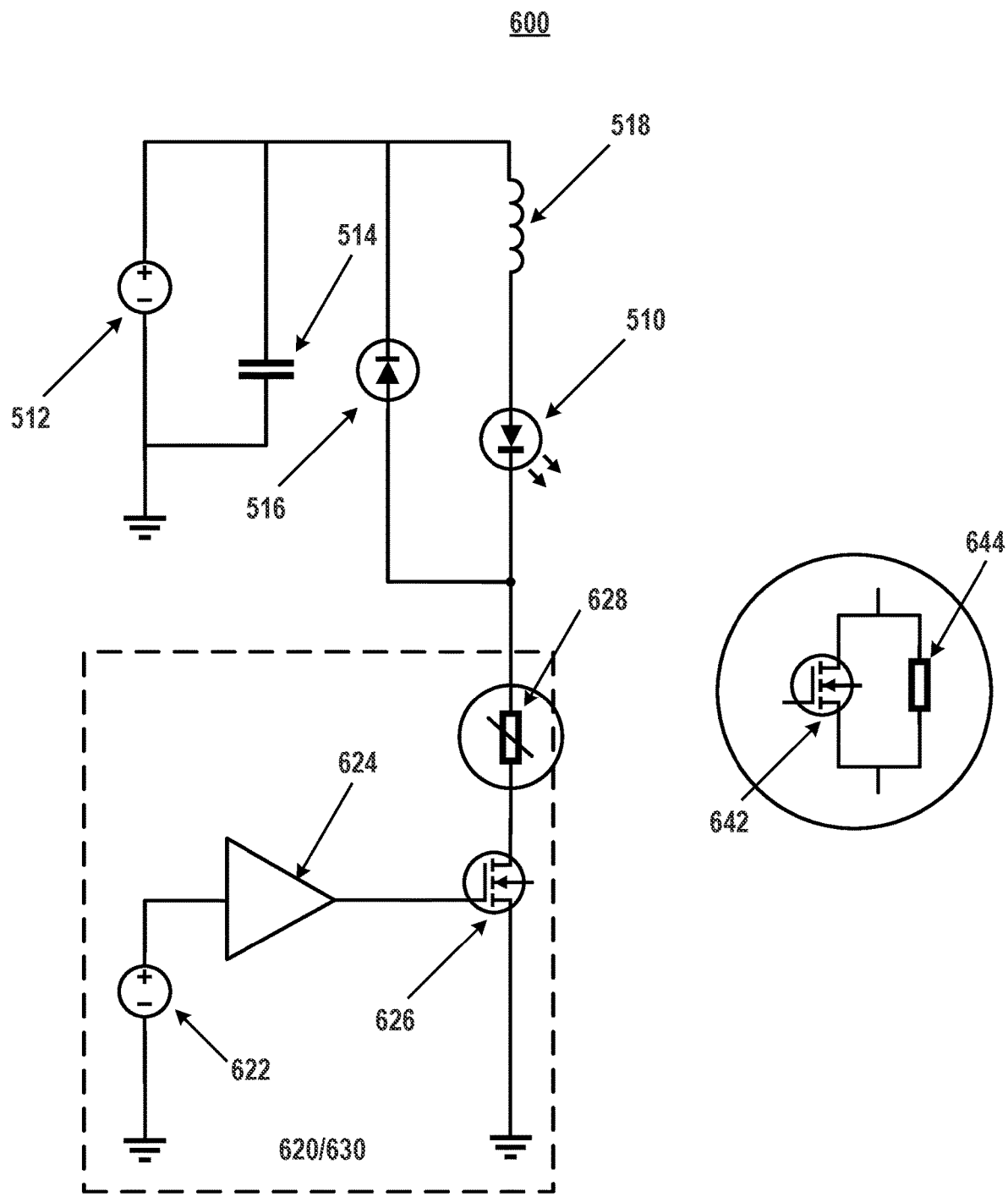
FIG. 6 illustrates another exemplary control system for a LiDAR system, according to embodiments of the disclosure.
Figure 7:
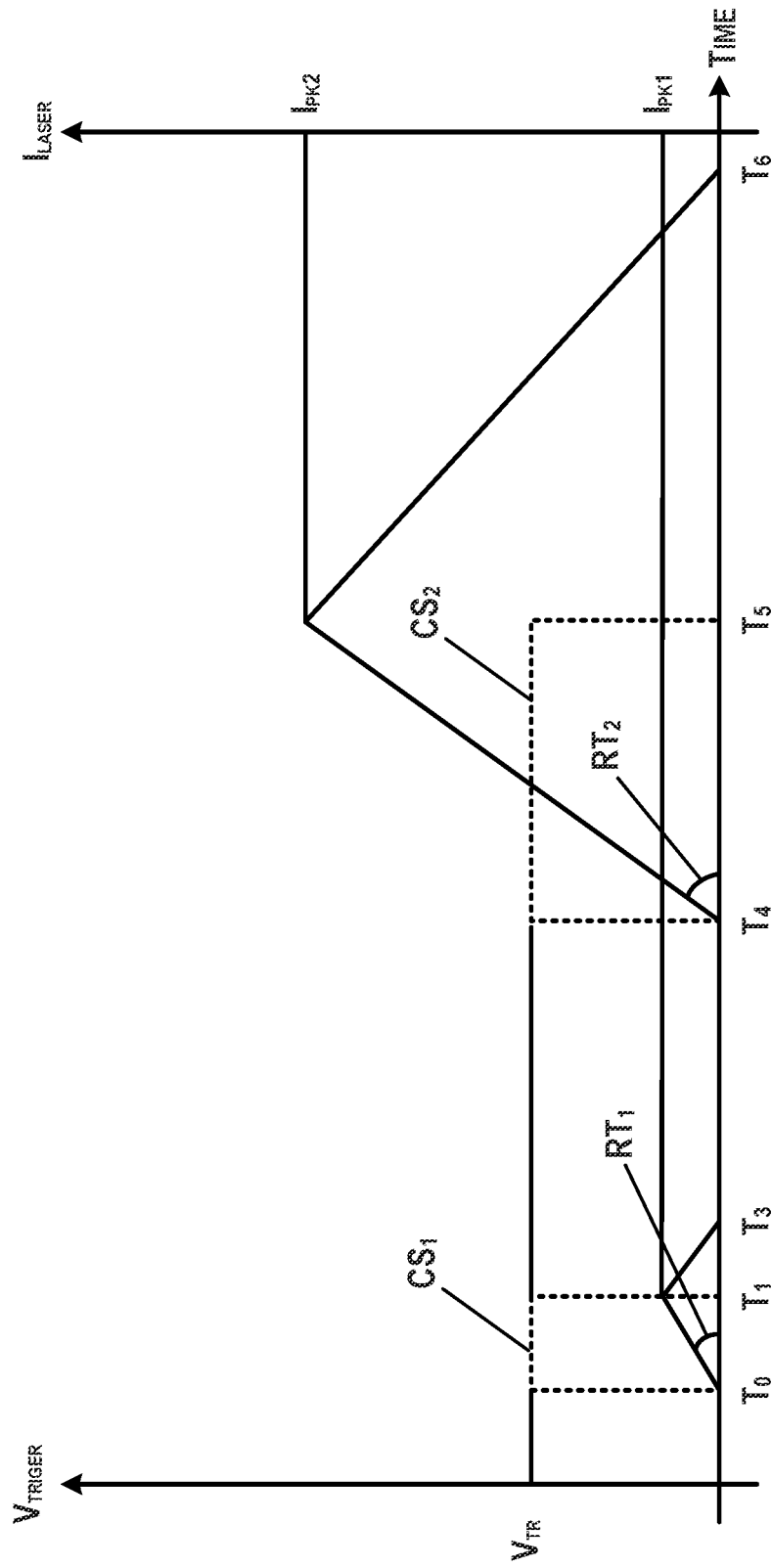
FIG. 7 illustrates exemplary control signal curves used and corresponding electrical current curves generated in a LiDAR system, according to embodiments of the disclosure.
Figure 8:
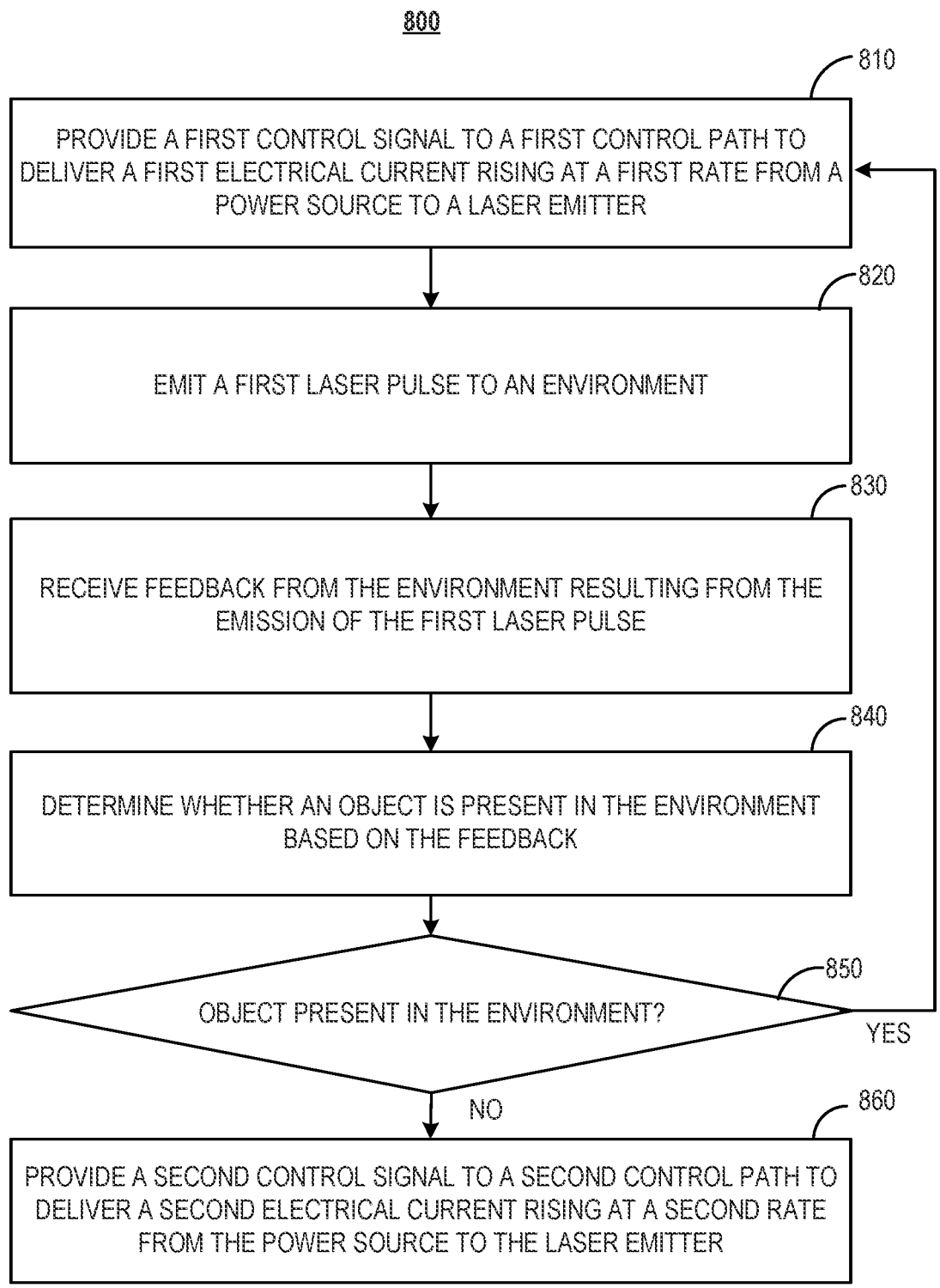
FIG. 8 illustrates a flowchart of an exemplary method for controlling laser pulses emitted by a LiDAR system, according to embodiments of the disclosure.

FIGS. 5 and 6 illustrate two exemplary control systems for controlling laser pulse emission in a LiDAR system. FIG. 7 illustrates exemplary control signal curves used and corresponding electrical current curves generated in the LiDAR system equipped with the control systems shown in FIG. 5 or 6. FIG. 8 illustrates a flowchart of an exemplary method for controlling laser pulses emitted by the LiDAR system equipped with the control systems shown in FIG. 5 or 6. FIGS. 5-8 will be described together below.

Referring to FIG. 5, an exemplary control system 500 may include a laser emitter 510 configured to emit a plurality of laser pulses. Laser emitter 510 may include any laser emitting units of laser source 208 describe above. For simplicity, a laser emitting diode is used to represent laser emitter 510. Laser emitter 510 may be coupled to a power source 512. Stray inductance can be represented by an inductor 518 between laser emitter 510 and power source 512. In addition, a clamp diode 516 is connected in parallel to laser emitter 510 to limit the voltage drop across laser emitter 510. A decoupling capacitor 514 is connected across power source 512 to stabilize the power supply voltage level. Power source 512 may include any suitable power sources and is represented by a voltage source in FIG. 5. Power source 512 may be configured to deliver electrical currents to laser emitter 510 for emitting the plurality of laser pulses. The delivery of electrical currents from power source 512 to laser emitter 510 can be controlled by a control circuit including a first control path 520 and a second control path 530.

Control path 520 may include a first switching device 526 coupled to laser emitter 510. Switching device 526 may include any suitable switches such as a field-effect transistor (FET). For example, switching device 526 may include a metal-oxide-semiconductor field-effect transistor (MOSFET), a gallium nitride field-effect transistor (GaNFET), etc. Switching device 526 may be controlled by a first control signal applied to its gate terminal. In FIG. 5, the first control signal is shown to be generated by a first trigger generator 522 and applied to the gate terminal of switching device 526 through a first operational amplifier (opamp) 524. In some embodiments, trigger generator 522 and/or opamp 524 may be part of controller 206, or controller 206 may generate the first control signal and apply the first control signal to the gate terminal of switching device 526 to control the switching operations of switching device 526. In some embodiments, control path 520 may include a resistor 528 coupled to switching device 526. In other embodiments, resistor 528 may be omitted.

Control path 530 may include a second switching device 536 coupled to laser emitter 510. Similar to switching device 526, switching device 536 may include any suitable switches, such as MOSFET, GaNFET, etc. Switching device 536 may be controlled by a second control signal applied to its gate terminal. In FIG. 5, the second control signal is shown to be generated by a second trigger generator 532 and applied to the gate terminal of switching device 536 through a second operational amplifier (opamp) 534. In some embodiments, trigger generator 532 and/or opamp 534 may be part of controller 206, or controller 206 may generate the second control signal and apply the second control signal to the gate terminal of switching device 536 to control the switching operations of switching device 536.

FIG. 6 shows another exemplary control system 600, which is similar to control system 500 except the control circuit portion. As shown in FIG. 6, first and second control paths 620 and 630 share the same switching device 626, opamp 624, and trigger generator 622. A variable resistor 628 is coupled between laser emitter 510 and switching device 626 and configured to be set to different resistance values for first and second control paths. Variable resistor 628 may be implemented in various ways. For example, variable resistor 628 may include a resistor 644 and a resistance controller 642 coupled to resistor 644. Resistance controller 642 may be implemented by a FET device and configured to short-circuit resistor 644 when the FET device is switched on, thereby altering the resistance of variable resistor 628.

An example method 800 for controlling laser pulse emission is shown in FIG. 8. Method 800 may be performed by LiDAR system 102 and may include steps 810-860. It is noted that in some embodiments, one or more steps may be omitted. In addition, the steps may be performed in a different order than that shown in FIG. 8, and multiple steps may be performed simultaneously.

In step 810, controller 206 may provide a first control signal to a first control path (e.g., control path 520/620) to deliver a first electrical current rising at a first rate from a power source (e.g., power source 512) to a laser emitter (e.g., laser emitter 510). Referring back to FIG. 5, controller 206 (e.g., represented by trigger generator 522) may provide the first control signal to the gate terminal of switching device 526 through opamp 524 to switch on switching device 526. This operation is also shown in FIG. 7, in which the first control signal is shown as a square wave trigger $CS_1$ in dashed line spanning from $T_0$ to $T_1$. The first control signal $CS_1$ has a voltage level $V_{TR}$, which is sufficiently high to switch on switching device 526. Once switching device 526 is switched on, a current loop is formed, from power source 512 through inductor 518, laser emitter 510, resistor 528 (if present), switching device 526, to the ground. As a result, a first electrical current starts to flow from power source 512 to laser emitter 510. The first electrical current is shown in FIG. 7, first as a rising ramp starting from $T_0$, reaching to the peak of $I_{PK1}$ at $T_1$, and then ramping down to zero at $T_3$. The rising rate from $T_0$ to $T_1$ is denoted as $RT_1$. Mathematically, the first electrical current $i_{LASER}$ during $T_0$ to $T_1$ can be written as a function of time as:

$$i_{LASER}(t) = \frac{(V_{supply} - V_{LD})}{L_{stray}} \cdot t, \quad (1)$$

when resistor 528 is not present, where $V_{supply}$ is the supply voltage of power source 512, $V_{LD}$ is the operation voltage of laser emitter 510, and $L_{stray}$ is the inductance of stray inductor 518. When resistor 528 is present, the first electrical current $i_{LASER}$ during $T_0$ to $T_1$ can be written as a function of time as:

$$i_{LASER}(t) = \frac{(V_{supply} - V_{LD})}{R_{atten}} \cdot \left(1 - e^{-\frac{R_{atten}}{L_{stray}}t}\right), \quad (2)$$

where $R_{atten}$ is the resistance of resistor 528. The rising rate of the first electrical current can be written as the first derivative of $i_{LASER}$: $RT_1 = di_{LASER}/dt$. Rising rate $RT_1$ can be approximated using the angle formed by the rising portion of the first electrical current and the time axis, as shown in FIG. 7.

Referring back to FIG. 8, as the first electrical current is flowing through laser emitter 510, laser emitter 510 may emit a first laser pulse to an environment surrounding LiDAR system 102 (step 820). In some embodiments, the first electrical current is controlled to be small enough so that the power of the emitted laser pulse meets the eye-safety requirements. For example, laser pulse 410 in FIG. 4 may represent the first laser pulse. In step 830, receiver 204 may receive feedback from the environment resulting from the emission of the first laser pulse. For example, photodetector 216 may detect any returned laser pulse resulting from the first laser pulse being reflected by an object in the near-field region of the environment. In step 840, controller 205 may determine whether an object is present in the environment based on the feedback. For example, when a reflected laser pulse is detected by photodetector 216, or the detected signal is larger than a threshold, controller 206 may determine that an object is present (e.g., the scenario of receiving reflected laser pulse 412 in FIG. 4). Otherwise, controller 206 may determine that no object is present (e.g., the scenario of receiving no reflected laser pulse after emitting laser pulse 430 in FIG. 4). Based on the determination, a selection is made in step 850. If an object is present in the environment (YES branch of step 850), method 800 loops back to step 810 to start another emission cycle of emitting a low-power pilot pulse. If no object is present (NO branch of step 850), method 800 proceeds to step 860, in which controller 206 may provide a second control signal to a second control path (e.g., 530/630) to deliver a second electrical current rising at a second rate from the power source to the laser emitter. The emission of the second laser pulse (shown in FIG. 4 as laser pulse 440) is described in more detail below.

Referring back to FIG. 5, control path 530 is used to deliver a second electrical current to laser emitter 510 to emit the second laser pulse. Similar to the case of control path 520, switching device 536 of control path 530 can be switched on by a second control signal provided by controller 206 (represented by trigger generator 532 in FIG. 5) and applied to the gate terminal of switching device 536 through opamp 534. In FIG. 7, this switching on process is shown from $T_4$ to $T_5$, a duration the second control signal (e.g., a trigger voltage $CS_2$) lasts. During this time period, the second electrical current ramps up rising at a second rate $RT_2$, similarly represented by equation (1) and approximated by the angle formed by the rising portion of the second electrical current and the time axis. The second electrical current reaches its peak $I_{PK2}$ at time point $T_5$, then ramps down to zero at time point $T_6$.

One objective of the present application is to generate a relatively large power ratio between the first and second laser pulses. Conventional two-pulse systems fail to achieve this because $RT_1$ and $RT_2$ are the same in those systems. As a result, the second electrical current rises at the same rate as the first electrical current during the switching on period, and the only way to generate a second pulse having a higher power is to prolong the trigger duration (e.g., $T_5-T_4$), resulting in larger pulse width. However, larger pulse width will degrade the performance of LiDAR detection. Embodiments of the present application address this problem by making $RT_2 > RT_1$. Therefore, the second electrical current rises faster than the first electrical current, thereby reach a higher peak during the same trigger duration. In this way, a higher power second laser pulse can be emitted.

There are several ways to achieve a larger $RT_2$ than $RT_1$. In one example, as shown in FIG. 5, resistor 528 may be used to increase the resistance of the first control path 520. As a result, the first electrical current is represented by equation (2). In the second control path 530, no resistor is used. Therefore, the second electrical current is represented by equation (1). Comparing equations (1) and (2), the introduction of resistor 528 reduces the rising rate of the electrical current used to drive laser emitter 510, thereby achieving $RT_1 < RT_2$.

In another example, different kinds of devices may be used as switching devices 526 and 536. To keep the rising rate of the first electrical current slow, switching device 526 may have a slower switching speed than switching device 536. For instance, a MOSFET may be used as switching device 526, while a faster GaNFET may be used as switching device 536.

Using slower and faster switching devices in the first and second control paths, respectively, and introducing a resistor into the first control path can each independently achieve $RT_1 < RT_2$. In some embodiments, these two methods can also be combined.

In a further example, as shown in FIG. 6, instead of using two separate switching devices, a single switching device 626 may be shared by the first and second control paths 620 and 630. Here, control paths 620 and 630 refers to electrical current passages at different operation durations (e.g., control path 620 is from $T_0$ to $T_3$ and control path 630 is from $T_4$ to $T_6$). The difference between control paths 620 and 630 is achieved by variable resistor 628, which increase its resistance during the emission of the first laser pulse, or decreases its resistance during the emission of the second laser pulse. As discussed above, variable resistor 628 may be implemented using resistor 644 and switch 642 connected in parallel, such that switch 642 when switched on short-circuit resistor 644, reducing the resistance of variable resistor 628. In this way, $RT_1 < RT_2$ can also be achieved.

Another aspect of the disclosure is directed to a non-transitory computer-readable medium storing instructions which, when executed, cause one or more processors to perform the methods, as discussed above. The computer-readable medium may include volatile or non-volatile, magnetic, semiconductor, tape, optical, removable, non-removable, or other types of computer-readable medium or computer-readable storage devices. For example, the computer-readable medium may be the storage device or the memory module having the computer instructions stored thereon, as disclosed. In some embodiments, the computer-readable medium may be a disc or a flash drive having the computer instructions stored thereon.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

The invention claimed is:

1. A system for controlling laser pulses emitted by an optical sensing device, the system comprising:
   a laser emitter configured to emit a plurality of laser pulses;
   a power source coupled to the laser emitter and configured to deliver electrical currents to the laser emitter for emitting the plurality of laser pulses;
   a control circuit configured to deliver electrical currents from the power source to the laser emitter, the control circuit comprising:
      a first control path configured to deliver a first electrical current rising at a first rate from the power source to the laser emitter to emit a first laser pulse; and
      a second control path configured to deliver a second electrical current rising at a second rate from the power source to the laser emitter to emit a second laser pulse following the first laser pulse, wherein the second rate is higher than the first rate; and
   a controller configured to:
      provide a first control signal to the first control path to deliver the first electrical current to the laser emitter for a first time period; and
      provide a second control signal to the second control path to deliver the second electrical current to the laser emitter for a second time period that is longer than the first time period.

2. The system of claim 1, wherein:
   the first control path comprises a first switching device coupled to the laser emitter, the first switching device being configured to be switched on at a first time point to enable delivery of the first electrical current from the power source to the laser emitter; and
   the second control path comprises a second switching device that is separate from the first switching device, the second switching device being configured to be switched on at a second time point that is later than the first time point to enable delivery of the second electrical current from the power source to the laser emitter.

3. The system of claim 2, wherein:
   the first switching device has a slower switching speed than the second switching device.

4. The system of claim 3, wherein the first switching device comprises a metal-oxide-semiconductor field-effect transistor (MOSFET).

5. The system of claim 3, wherein the second switching device comprises a gallium nitride field-effect transistor (GaNFET).

6. The system of claim 2, wherein:
   the first control path has a higher resistance than the second control path.

7. The system of claim 6, wherein:
   the first control path comprises a resistor coupled to the first switching device to increase resistance of the first control path.

8. The system of claim 1, wherein:
   the first and second control paths share a switching device and a variable resistor coupled to the switching device; and
   the variable resistor is configured to be set to a higher resistance value when the first control path is switched on by the switching device to deliver the first electrical current and set to a lower resistance value when the second control path is switched on by the switching device to deliver the second electrical current.

9. The system of claim 8, wherein:
   the variable resistor comprises a resistor and a resistance controller coupled to the resistor, the resistance controller being configured to short-circuit the resistor when the second control path is switched on by the switching device to deliver the second electrical current.

10. A method for controlling laser pulses emitted by an optical sensing device, the method comprising:
providing, by a controller of the optical sensing device, a first control signal to a first control path to deliver a first electrical current rising at a first rate from a power source to a laser emitter to emit a first laser pulse to an environment surrounding the optical sensing device;
determining, by the controller, whether an object is present in the environment based on feedback received from the environment resulting from the emission of the first laser pulse;
after it is determined that no object is present in the environment, providing, by the controller, a second control signal to a second control path to deliver a second electrical current rising at a second rate from the power source to the laser emitter to emit a second laser pulse to the environment, wherein the second rate is higher than the first rate;
providing, by the controller, the first control signal to the first control path to deliver the first electrical current to the laser emitter for a first time period; and
providing, by the controller, the second control signal to the second control path to deliver the second electrical current to the laser emitter for a second time period that is longer than the first time period.

11. The method of claim 10, wherein:
the first control signal comprises a first trigger to turn on a first switching device in the first control path at a first time point to enable delivery of the first electrical current from the power source to the laser emitter; and
the second control signal comprises a second trigger to turn on a second switching device in the second control path at a second time point that is later than the first time point to enable delivery of the second electrical current from the power source to the laser emitter.

12. The method of claim 10, wherein the first control signal comprises:
a resistance control signal to increase a resistance value of a variable resistor shared by the first and second control paths; and
a trigger to turn on a switching device shared by the first and second control paths to enable delivery of the first electrical current from the power source to the laser emitter.

13. The method of claim 10, wherein the second control signal comprises:
a resistance control signal to decrease a resistance value of a variable resistor shared by the first and second control paths; and
a trigger to turn on a switching device shared by the first and second control paths to enable delivery of the second electrical current from the power source to the laser emitter.

14. An optical sensing system, comprising:
a laser emitter configured to emit a plurality of laser pulses;
a control circuit coupled to the laser emitter and configured to deliver electrical currents from a power source to the laser emitter to emit the plurality of laser pulses; and
a controller coupled to the control circuit and configured to provide control signals to the control circuit to control delivery of the electrical currents;
wherein:
the control circuit comprises a first control path configured to deliver a first electrical current rising at a first rate from the power source to the laser emitter to emit a first laser pulse to an environment surrounding the optical sensing system;
the controller is configured to determine whether an object is present in the environment based on feedback from the environment resulting from the emission of the first laser pulse;
the control circuit further comprises a second control path configured to deliver a second electrical current rising at a second rate from the power source to the laser emitter to emit a second laser pulse following a determination that no object is present in the environment, wherein the second rate is higher than the first rate;
the controller is configured to provide a first control signal to the first control path to deliver the first electrical current to the laser emitter for a first time period; and
the controller is configured to provide a second control signal to the second control path to deliver the second electrical current to the laser emitter for a second time period that is longer than the first time period.

15. The optical sensing system of claim 14, wherein:
the first control path comprises a first switching device coupled to the laser emitter, the first switching device being configured to be switched on at a first time point to enable delivery of the first electrical current from the power source to the laser emitter; and
the second control path comprises a second switching device that is separate from the first switching device, the second switching device being configured to be switched on at a second time point that is later than the first time point to enable delivery of the second electrical current from the power source to the laser emitter.

16. The optical sensing system of claim 15, wherein:
the first switching device has a slower switching speed than the second switching device.

17. The optical sensing system of claim 15, wherein:
the first control path has a higher resistance than the second control path.

\* \* \* \* \*